United States Patent [19]

Marikar et al.

[11] Patent Number: 5,017,420

[45] Date of Patent: May 21, 1991

[54] PROCESS FOR PREPARING ELECTRICALLY CONDUCTIVE SHAPED ARTICLES FROM POLYBENZIMIDAZOLES

[75] Inventors: Y. M. Faruq Marikar, Scotch Plains; Michael M. Besso, West Orange, both of N.J.

[73] Assignee: Hoechst Celanese Corp., Somerville, N.J.

[21] Appl. No.: 362,157

[22] Filed: Jun. 6, 1989

Related U.S. Application Data

[62] Division of Ser. No. 189,769, May 3, 1988, Pat. No. 4,868,008, which is a division of Ser. No. 922,431, Oct. 23, 1986, Pat. No. 4,759,986.

[51] Int. Cl.$^5$ .................... B01D 39/16; B01D 71/64; B32B 7/02; B32B 27/02; C08J 5/06; C08J 5/22; C09J 7/00; H01B 1/20

[52] U.S. Cl. .................... 428/212; 156/309.6; 162/157.2; 162/164.1; 162/164.3; 162/164.4; 174/126.2; 210/500.23; 210/500.39; 252/518; 264/257; 264/258; 427/126.1; 428/220; 428/229; 428/252; 428/265; 428/266; 428/267; 428/272; 428/287; 428/288; 428/308.4; 428/313.3; 428/315.5; 428/315.9; 428/318.8; 428/346; 428/354; 428/355; 428/376; 428/389; 428/698; 521/27; 521/30

[58] Field of Search ............... 162/157.2, 164.1, 164.3, 162/164.4; 174/126.2; 428/212, 220, 229, 252, 265, 266, 267, 272, 287, 288, 308.4, 315.5, 386, 355, 698; 210/500.23, 500.39; 521/27, 30

[56] References Cited

U.S. PATENT DOCUMENTS

| | | |
|---|---|---|
| 3,958,066 | 5/1976 | Imamura et al. |
| 4,301,196 | 11/1981 | McCormack et al. ............... 427/98 |
| 4,374,893 | 2/1983 | Arsac ................... 428/263 |
| 4,634,530 | 1/1987 | Kuder ................... 210/500.23 |
| 4,759,986 | 7/1988 | Marikar et al. ................ 428/292 |

OTHER PUBLICATIONS

Tomibe et al., Japanese Unexamined Patent Application 55-51873, published 4/15/80.
Aharoni et al., *J. of Appl. Polymer Sci.*, 23(9), May 1, 1979.

*Primary Examiner*—James C. Cannon
*Attorney, Agent, or Firm*—Burns, Doane, Swecker & Mathis

[57] ABSTRACT

An electrically conductive shaped article such as a film or fibrous material and a process for preparing the same from a polybenzimidazole shaped article is provided. The polybenzimidazole article is first contacted with cuprous ions to produce a cuprous ion-impregnated material, and subsequently is subjected to a sulfiding agent capable of sulfiding cuprous ions, and preferably washed, to produce a polybenzimidazole shaped article having covellite copper sulfide in association therewith. Also provided are electrically conductive composites and a process for preparing the same by incorporating fibrous material prepared in accordance with the process within a substantially continuous polymeric matrix.

27 Claims, 8 Drawing Sheets

4,000 x 2,000 x

PROCESS FOR PREPARING ELECTRICALLY CONDUCTIVE SHAPED ARTICLES FROM POLYBENZIMIDAZOLES

This application is a divisional of application Ser. No. 189,769, filed May 3, 1988, now U.S. Pat. No. 4,868,008, which was a divisional of application Ser. No. 922,431, filed Oct. 23, 1986, now U.S. Pat. No. 4,759,986.

BACKGROUND AND OBJECTS OF THE INVENTION

This invention relates to a process for preparing electrically conductive shaped articles such as films or fibrous material from a polybenzimidazole, and to the conductive shaped articles produced thereby. The invention further relates to an electrically conductive composite comprising electrically conductive polybenzimidazole fibrous material and to a process for preparing such material. The invention is useful for EMI shielding and static dissipation, in forming electrically conductive resins and paints, and as a membrane in certain gas or liquid separations.

It is known in the art to plate copper metal onto various polymeric substrates. For example, Davis U.S. Pat. No. 4,143,186 discloses a process for electroless plating of copper on substrates such as polyimides and polyparabanic acids (polyimidazoletriones) comprising deposition of copper in an acidic bath containing a divalent copper salt such as copper sulfate and a reducing agent such as dimethyl amine borane, wherein the copper salts may be present in a concentration of between 0.05 and 0.15M.

Further, McCormack et al U.S. Pat. No. 4,301,196 discloses a process for electroless plating of copper by employing a bath comprising copper ions, a reducing agent, a pH adjustor, and a depolarizing agent. The depolarizing agent can be 1,3-imidazole, benzimidazole, and the like (Column 4, lines 24–45). The process may be employed to electrolessly deposit copper on paper, glass, or synthetic resins and plastics including nylons, acrylic, Mylar ® polyester film, and epoxies (Column 7, lines 31–136). See also, U.S. Pat. Nos. 3,736,170; 3,993,801; 4,199,623; 4,209,331; and 4,261,800, which disclose various processes for electroless deposition of copper onto polymeric substrates.

U.S. Pat. No. 4,374,893 discloses the preparation of textiles based upon synthetic polymers such as polyesters and polyamides, having a surface coating of at least 3 percent copper sulfide, the composition of which is such that the atomic ratio Cu/S is between 1.5 and 2, preferably more than 1.7. The copper sulfide is formed by a process comprising treatment with hydrogen sulfide, followed by contact with at least one reducing agent and copper cations provided by a copper salt.

It is also known to form metal salt complexes of alkylbenzimidazole polymers wherein such salts may be prepared by mixing dimethylsulfoxide solutions of an inorganic metal salt and subsequently stripping off the DMSO solvent such that metal is complexed within the benzimidazole rings. Suitable metal cations include Cu(II), Zn(II), and Cd(II). The electrical resistivity of the resultant salt may be increased by a factor of twenty or more relative to the neutral polymer. [Aharoni et al, "Electrical Resistivities and ESCA Studies on Neutral Poly(alkylbenzimidazole), Their Salts and Complexes," *Journal of Applied Polymer Science*, Volume 23, 2363–2660 (1979)].

It is therefore an object of the present invention to provide a process for preparing an improved highly electrically conductive shaped article such as a film or fibrous material.

It is a still further object of the present invention to provide a process for preparing a improved electrically conductive shaped article which is flexible and ductile.

It is a further object of the present invention to provide an improved electrically conductive shaped article having high levels of covellite copper sulfide in association therewith, wherein the copper sulfide is substantially entirely in the form of covellite copper sulfide.

It is a still further object of the invention to provide a process for preparing a composite article which incorporates an improved electrically conductive fibrous material which is heat stable and which may be processed in a molten resinous matrix without destruction of the fibrous material.

It is a still further object of the invention to provide an electrically conductive monolithic composite incorporating an improved electrically conductive fibrous material.

It is a still further object of the invention to provide an electrically conductive polymer composition incorporating an improved electrically conductive fibrous material.

It is a still further object of the invention to produce conductive shaped articles which are suitable for use in EMI shielding applications and other applications where electrically conductive media are desired.

It is a still further object of the invention to produce a conductive film which is suitable for use in gas or liquid separators.

It is another object of the invention to produce patterned conductor film or sheet material for use as heating elements or in electronic circuitry such as printed circuit boards.

These and other objects, as well as the scope, nature, and utilization of the claimed invention will be apparent to those skilled in the art by the following detailed description and appended claims.

SUMMARY OF THE INVENTION

According to the present invention, an electrically conductive shaped article is prepared from a polybenzimidazole shaped article by:

(a) contacting the polybenzimidazole shaped article with a source of cuprous ions to produce a cuprous ion-impregnated article;

(b) contacting the resulting cuprous ion-impregnated polybenzimidazole shaped article with a sulfiding agent capable of sulfiding the cuprous ions to form electrically conductive covellite copper sulfide in association with said polybenzimidazole; and, optionally, (c) washing the resulting electrically conductive polybenzimidazole shaped article to substantially remove residual reactants adhering thereto.

In a preferred embodiment, an electrically conductive shaped article is prepared from a polybenzimidazole shaped article by:

(a) cuprous ion-impregnating the polybenzimidazole shaped article with an aqueous solution to which was added a concentration of approximately 0.25 to 10 weight percent of copper ions, added as copper sulfate, and between about 0.5 and 10 weight percent of an hydroxylamine reducing agent, while at a temperature of between about 80° C. and about 105° C. for between about 15 minutes and about 2 hours;

(b) subjecting the resulting cuprous ion-impregnated polybenzimidazole shaped article to a sulfiding treatment in a solution comprising a thiosulfate sulfiding agent in a concentration of approximately 5 to 15 percent by weight while at a temperature of between about 90° C. and about 105° C. for an additional period of time between about 15 minutes and about 2 hours effective to produce an electrically conductive shaped article having covellite copper sulfide in association therewith; and (c) washing the resulting electrically conductive shaped article to substantially remove residual reactants adhering thereto.

In another aspect of the invention, an electrically conductive fibrous material is provided which comprises polybenzimidazole fibrous material in association with approximately 5 to 60 percent, and preferably 35 to 60 percent, by weight of covellite copper sulfide, based upon the total weight of the product.

In yet another aspect of the invention, electrically conductive film and fibrous material are provided which comprises polybenzimidazole film material and fibrous material, respectively, in association with approximately 5 to 60 percent by weight of covellite copper sulfide, based upon the total weight of the product.

In still another aspect of the invention, an electrically conductive composite article is prepared by a process comprising the steps of:

(a) cuprous ion-impregnating a polybenzimidazole fibrous material with a solution of a cupric salt and a reducing agent capable of reducing cupric ions to cuprous ions;

(b) subjecting the resulting cuprous ion-impregnated fibrous material to a sulfiding treatment in a solution comprising a sulfiding agent capable of sulfiding said cuprous ions to covellite copper sulfide so as to produce electrically conductive polybenzimidazole fibrous material;

(c) washing the resulting electrically conductive polybenzimidazole fibrous material to remove residual reactants adhering thereto; and (d) surrounding the resulting electrically conductive fibrous material with a substantially continuous polymeric matrix to produce a monolithic electrically conductive composite article.

In still another aspect of the invention, a monolithic electrically conductive composite article is provided which comprises electrically conductive polybenzimidazole fibrous material in association with approximately 5 to 60 percent by weight of covellite copper sulfide based upon the total weight of the conductive fibrous product, incorporated within a substantially continuous polymeric matrix.

In another aspect of the invention, a monolithic electrically conductive article comprising a fabric, paper, or felt is provided which includes polybenzimidazole fibrous material in association with approximately 5 to 60 weight percent of covellite copper sulfide, the fabric, paper, or felt being incorporated within a solid, continuous, polymeric matrix.

In yet another aspect of the invention, a polymer composition suitable for use in electrically conductive end uses is provided, comprising electrically conductive polybenzimidazole fibrous material in association with approximately 5 to 60 weight percent of covellite copper sulfide and a polymeric carrier.

In another aspect of the invention, a monolithic electrically conductive composite article is provided, comprising polybenzimidazole fibrous material in association with approximately 35 to 60 percent by weight of covellite copper sulfide incorporated within a solid, continuous, cured epoxy resin matrix.

In another aspect of the present invention, a sheetlike article is provided, comprising polybenzimidazole fibrous material in association with from about 3 to about 60 percent by weight of electrically conductive covellite copper sulfide, the sulfide being present in at least one layer comprising a multiplicity of the fibers and having a thickness of approximately 1 mil to 1 inch, the article having a sheet resistivity of from about 1 to about 1000 ohms/sheet.

DESCRIPTION OF THE PREFERRED EMBODIMENTS

Figure 1:
FIG. 1 is a transmission electron micrograph (10,000X) of a thin cross-section of a sample of conductive bilobal polybenzimidazole fiber associated with covellite copper sulfide.

The shaped article which is rendered electrically conductive in accordance with the present invention is a preformed polybenzimidazole material which can be produced in various forms, e.g. solid thin films, flat films, porous, microporous, or semi-permeable membranes, solid or hollow fibers and the like, by methods previously known in the art. For example, the shaped article can be a fibrous material in the form of staple yarns, continuous filament yarns, multifilamentary tows, tapes, strands, cables, fibrils, fibrids, papers, woven fabrics, nonwoven fabrics, and the like.

The linear polybenzimidazoles which are used as the starting material in the present invention are a known class of heterocyclic polymers. Typical polymers of this class and their preparation are more fully described in U.S. Pat. No. 2,895,948, U.S. Pat. No. 26,065, and in the *Journal of Polymer Science*, Vol. 50, pages 511–539 (1961), the contents of which are herein incorporated by reference. The polybenzimidazoles comprise recurring units selected from the group consisting of units of the following Formulas I and II, and preferably consist essentially of such recurring units. Formula I is:

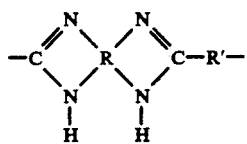

wherein R is a tetravalent aromatic nucleus, preferably asymmetrically substituted, with the nitrogen atoms forming the benzimidazole rings being paired upon adjacent carbon atoms, i.e., ortho carbon atoms, of the aromatic nucleus, and R' is a member of the group consisting of (1) an aromatic ring, (2) an alkylene group (preferably those having 4 to 8 carbon atoms), and (3) a heterocyclic ring from the group consisting of (a) pyridine, (b) pyrazine, (c) furan, (d) quinoline, (e) thiophene, and (f) pyran.

Formula II is:

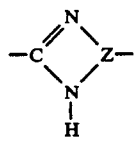

wherein Z is an aromatic nucleus having the nitrogen atoms forming the benzimidazole ring paired upon adjacent carbon atoms of the aromatic nucleus.

Preferably, aromatic polybenzimidazoles are selected, e.g., polymers consisting essentially of the recurring units of Formulas I and II wherein R' is at least one aromatic ring or a heterocyclic ring.

As set forth in U.S. Pat. No. 26,065, the aromatic polybenzimidazoles having the recurring units of Formula II may be prepared by self-condensing a trifunctional aromatic compound containing only a single set of ortho disposed diamino substituents and an aromatic, preferably phenyl, carboxylate ester substituent Exemplary of polymers of this type is poly-2,5(6)-benzimidazole prepared by the autocondensation of phenyl 1,4-diaminobenzoate.

As set forth in the above-mentioned patent, the aromatic polybenzimidazoles having the recurring units of Formula I may be prepared by condensing an aromatic tetraamine compound containing a pair of ortho diamino substituents on the aromatic nucleus with a dicarboxylic compound selected from the class consisting of (a) the diphenyl ester of an aromatic dicarboxylic acid, (b) the diphenyl ester of a heterocyclic dicarboxylic acid wherein the carboxyl groups are substituents upon a carbon in a ring compound selected from the group consisting of pyridine, pyrazine, furan, quinoline, thiophene, and pyran and (c) an anhydride of an aromatic dicarboxylic acid.

Examples of polybenzimidazoles which have the recurring structure of Formula I are as follows:
poly-2,2'(m-phenylene)-5,5'-bibenzimidazole;
poly-2,2'-(pyridylene-3",5")-5,5'-bibenzimidazole;
poly-2,2'-(furylene-2",5")-5,5'-bibenzimidazole;
poly-2,2'-(naphthalene-1",6")-5,5'-bibenzimidazole;
poly-2,2'-(biphenylene-4",4")-5,5'-bibenzimidazole;
poly-2,2'-amylene-5,5'-bibenzimidazole;
poly-2,2'-octamethylene-5,5'-bibenzimidazole;
poly-2,6-(m-phenylene)-diimidazobenzene;
poly-2,2'-cyclohexeneyl-5,5'-bibenzimidazole;
poly-2,2'-(m-phenylene-5,5'-di(benzimidazole) sulfide;
poly-2,2'-(m-phenylene-5,5'-di(benzimidazole) sulfone;
poly-2,2'-(m-phenylene-5,5'-di(benzimidazole) ether;
poly-2,2'-(m-phenylene-5,5'-di(benzimidazole) methane;
poly-2'2,2'-(m-phenylene-5',5"-di(benzimidazole) propane-2,2';
and poly-2',2"(m-phenylene-5',5"-di(benzimidazole) ethylene-1,2,
where the double bonds of the ethylene groups are intact in the final polymer.

Another polybenzimidazole that is suitable for use in the present process is one prepared from poly-2,2'-(m-phenylene)-5,5'bibenzimidazole, the recurring unit of which is:

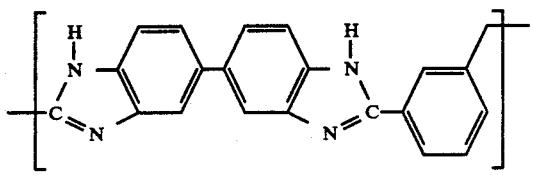

Any polymerization process known to those skilled in the art may be employed to prepare the polybenzimidazole which is utilized to form shaped articles for use in the process of the present invention. See, e.g., U.S. Pat. No. 3,669,038, the content of which is hereby incorporated by reference. With respect to aromatic polybenzimidazoles, preferably, equimolar quantities of the monomeric tetraamine and dicarboxyl compound may be introduced into a first stage melt polymerization reaction zone and heated therein at a temperature above about 300° C., preferably at least 250° C., and more preferably from about 270° C. to 300° C. The reaction is conducted in a substantially oxygen-free atmosphere, i.e., below about 20 p.p.m. oxygen and, preferably, below about 8 p.p.m. oxygen, until a foamed prepolymer is formed. Usually, the first stage reaction is continued until a prepolymer is formed having an inherent viscosity, expressed as deciliters per gram, of at least 0.1, and preferably from about 0.13 to 0.3 (determined from a solution of 0.4 grams of the polymer in 100 ml. of 97 percent $H_2SO_4$ at 25° C.).

After the conclusion of the first stage reaction, which normally takes at least 0.5 hour and, preferably, 1 to 3 hours, the foamed prepolymer is cooled and then powdered or pulverized in any convenient manner. The resulting prepolymer powder is then introduced into a second stage polymerization reaction zone wherein it is heated under substantially oxygen-free conditions, as described above, to yield a polybenzimidazole polymer product, desirably having an I.V., as measured above, of at least 0.4, e.g., 0.8 to 1.1 or more. When the polybenzimidazole polymer is to be utilized in the form of a hollow fiber, its preferred inherent viscosity is at least about 0.5, and, most preferably, in the range of from about 0.7 to about 1.4.

The temperature employed in the second stage is at least 250° C., preferably, at least 325° C., and, more preferably, from about 350° to 425° C. The second stage reaction generally takes at least 0.5 hours, and, preferably, from about 1 to 4 hours or more. It is of course also possible to prepare these polymers via a one-step reaction.

The solvents utilized to form the polybenzimidazole polymer solutions for producing the shaped articles used in the process of the present invention include those solvents which are commonly recognized as being capable of dissolving the particular polybenzimidazole polymer. For instance, the solvents may be selected from those commonly utilized in the formation of polybenzimidazole dry spinning solutions. Illustrative examples of suitable solvents include N,N-dimethylacetamide, N,N-dimethylformamide, dimethyl sulfoxide, and N-methyl-2-pyrrolidone. The particularly preferred solvent is N,N-dimethylacetamide. Additional representative solvents include formic acid, acetic acid, and sulfuric acid.

The polymer solutions may be prepared, for example, by dissolving sufficient polybenzimidazole in the solvent to yield a final solution containing from about 5 to 30 percent by weight of polymer based on the total weight of the solution, and preferably from about 10 to 20 percent by weight.

The quantity of polybenzimidazole dissolved in the solvent should be such that the resulting solution has a viscosity of about 50 to 4000 poises at 30° C., and preferably about 400 to 600 poises.

One suitable means for dissolving the polymer in the solvent is by mixing the materials at a temperature above the normal boiling point of the solvent, for example, about 25° to 120° C. above such boiling point, and at a pressure of 2 to 15 atmospheres for a period of 1 to 5 hours. The resulting solutions then preferably are filtered to remove any undissolved polymer. A minor amount of an additive such as lithium chloride optionally may be provided in the spinning solution in accordance with the teachings of commonly assigned U.S. Pat. Nos. 3,502,606 and 4,321,182. In addition to lithium chloride, suitable additives include zinc chloride, N-methyl morpholine, triethylamine and triethanolamine. Also suitable are organolithium compounds selected from the group consisting of $RCO_2Li$, $RSO_3Li$, $ROSO_3Li$, and mixtures thereof, wherein R is a hydrocarbon radical having from 1 to about 50 carbon atoms. Representative lithium salts are lithium formate, lithium acetate, lithium propionate, lithium butyrate, lithium isobutyrate, lithium valerate, lithium cetylate, lithium stearate, etc. Representative lithium hydrocarbon sulfonates are lithium lauryl sulfonate, lithium cetyl sulfonate, etc. Representative lithium hydrocarbon sulfates are lithium lauryl sulfate, lithium cetyl sulfate, etc. The preferred organolithium compound is lithium stearate The additive serves the function of preventing the polybenzimidazole polymer from phasing out of the solution upon standing for extended periods of time.

The formation of the various shaped articles for use in the process of the present invention may be conducted according to any of the suitable methods known in the art. For example, in the preparation of a porous, microporous or semipermeable membrane the solution of polybenzimidazole polymer is deposited upon a support to form a wet film of the same. The nature of the support is not critical and may be selected from a variety of materials including ceramic, polymeric compositions, glass, or metallic plates (e.g., stainless steel), or flexible, porous materials such as woven or non-woven fabrics. Such fabrics can comprise fibers of materials such as metals, inorganic compounds, minerals, glass and natural or synthetic polymers. The support is preferably provided with retaining sides, or raised edges, whereby the solution is confined to the surface thereof at the desired location until its consistency is such that retaining sides are no longer needed. Numerous techniques are available for the application of the solution to the support as will be apparent to those skilled in the art. For instance, the polybenzimidazole polymer solution may be simply poured upon a level support in a quantity sufficient for it to assume the desired uniform thickness. A blade optionally may be drawn over the surface of the wet film to aid the deposition of a wet film of uniform thickness. In a preferred embodiment of the invention, the solution is deposited by the utilization of a doctor blade caster. In a preferred embodiment of the invention, the solution is deposited by the utilization of a doctor blade caster. Reverse roll techniques and calender machines can also be employed. It is presently preferred to apply the polybenzimidazole polymer solution to a flexible porous support by doctor blade caster or reverse roll techniques.

The thickness of the wet film deposited upon the support is influenced by the desired thickness of the polybenzimidazole semipermeable membrane ultimately to be produced. Commonly the wet film is deposited upon the support in a substantially uniform thickness of about 1 to 30 mils and preferably 2 to 18 mils. In a particularly preferred embodiment of the invention, the wet film is deposited in a thickness of about 4 to 8 mils.

A quantity of solvent is next evaporated from the exposed surface o the wet film to allow the formation of a relatively thin solid layer (i.e., a thin porous polymeric film) on the exposed surface of the same. The thin solid film commonly exhibits a thickness of about 0.1 to 10 microns, and preferably about 1 to 5 microns. During the formation of the solid layer on the exposed surface of the film, the solvent present near the surface of the wet film is flashed off and a thick coagulated solid layer or skin of polybenzimidazole polymer remains. The remaining portion of wet film which supports the solid layer remains essentially unchanged while the solid layer is formed. The solid layer accordingly exhibits a density which is substantially greater than that of the remaining portion of the film which has not undergone coagulation and continues to possess a liquid consistency.

The evaporation of solvent from the exposed surface of the wet film may be accomplished by a variety of techniques, as will be apparent to those skilled in the art. For instance, a stream of air or other gas at ambient or at an elevated temperature (e.g., approaching the boiling point of the solvent) may be simply directed at the exposed surface of the wet film. Alternatively, the wet film may be simply allowed to stand in an uncirculated gaseous environment wherein the requisite degree of solvent evaporation is accomplished. In a further embodiment of the invention, the gaseous atmosphere to which the wet film is exposed may be at reduced pressure, e.g., 100 mm. Hg, up to near atmospheric pressure. It will be apparent to those skilled in the art that the rate at which the solvent is evaporated increases with the temperature of the gaseous atmosphere impinging upon the wet film, the flow rate of the gaseous atmosphere, and with reduced pressure. The time required to form the desired thin solid layer upon the exposed surface of the wet film commonly ranges from about 5 seconds to 30 minutes, and preferably from about 15 seconds to 5 minutes. In a preferred embodiment of the invention, the wet film is exposed to a stream of circulating air at ambient temperature (e.g., about 25° C.) and pressure for about 1 to 5 minutes. When the air is not circulated, longer exposure times advantageously may be employed.

The resulting film bearing a thin solid layer upon its surface is next converted to a semipermeable membrane by washing the same with a non-solvent for the polybenzimidazole polymer which is capable of removing residual quantities of the polybenzimidazole solvent. During the wash step, the remaining polybenzimidazole polymer within the wet film is coagulated while the solvent which originally dissolved the same is removed. The wash medium is preferably aqueous in nature, e.g., water containing less than about 10 weight percent of organic solvents miscible in water, and is most preferably water. Aqueous solutions of polybenzimidazole solvents, such as N,N'-dimethylacetamides or polyhydroxy aliphatic alcohols having from two to about six carbon atoms and two or three hydroxy groups, can be used. Such alcohols can be used neat as a preferred non-aqueous wash medium. The wash step is preferably carried out by immersing the film in the wash medium Alternatively, any other convenient means for contacting the film with the wash medium may be utilized, such as by spraying the film with the same. In a preferred embodiment of the invention a water wash medium is provided at a relatively cool temperature, e.g., at about 5° to 30° C., and at a temperature of about 10° to 25° C. in a particularly preferred embodiment. The time required to accomplish coagulation of the remaining polybenzimidazole polymer and the substantially complete removal of residual solvent for the same varies with the temperature of the wash medium. Satisfactory wash times commonly range from about 30 seconds to 20 minutes, and preferably about 2 to 5 minutes. Considerably longer wash times may be employed, but generally with no commensurate advantage.

The resulting flat film membranes formed of the polybenzimidazole polymer consist of an outer relatively thin surface layer formed during the evaporation step adjacent to a relatively thick layer of a more porous structure formed during the wash step.

Alternatively, the polybenzimidazole starting material may be formed into solid or hollow fibers according to processes well known in the art These fibers can be prepared by solution spinning using a dope of the polybenzimidazole polymer. Suitable solvents for the preparation of this dope include those solvents which are commonly recognized as being capable of dissolving the particular polybenzimidazole polymer, such as those solvents used in preparing the polymer solution for film preparation as previously described. Particularly preferred is a solvent system comprising N,N-dimethylacetamide and lithium chloride.

Using conventional equipment and techniques, the dope is placed in an extrusion or spinning bomb at the desired solids content. The amount of extrusion solids, of course, is dependent upon the viscosity and molecular weight of the particular polybenzimidazole polymer used. However, using N,N-dimethylacetamide and lithium chloride as a solvent system, solids concentrations in the range of about 20 to 30 weight percent are typical. In selecting the amount of solids to be used, it is generally desirable to use a dope having the highest possible viscosity which can still be extruded at the desired extrusion temperature. Extrusion temperatures generally range from about room temperature or slightly lower to as high as 150° to 180° C.

The bomb containing the spinning dope is attached to the spinnerette and pressurized with sufficient pressure to cause the polymer solution contained in the bomb to escape through the spinnerette jet It is, of course, understood that in order to prepare optimum hollow fibers the dope placed in the bomb should be filtered either prior to placing it in the bomb or just prior to spinning. The spinnerette or nozzle through which the hollow fibers are spun comprises an inner nozzle and a concentric nozzle arranged about the inner nozzle and is referred to as a concentric hollow jet spinnerette. In order to maintain the hollow configuration of spun fibers a fluid, either gaseous or liquid, is forced through the inner nozzle. Examples of this fluid include nitrogen and ethylene glycol.

As the polybenzimidazole polymer is spun it is fed into a coagulation bath, which bath comprises a solvent or solvent system which is a non-solvent for the polybenzimidazole polymer employed and preferably is a solvent for the dope solvent. Though the hollow fiber can be spun directly into the coagulation bath, it is preferred to expose the spun fiber to a gas capable of effecting surface coagulation or drying of the fiber. Generally, this can be accomplished by spinning the fiber into air for usually not more than 1 to 10 seconds, or in any case no longer than is required to coagulate a thin surface layer on the fiber. The preferred types of coagulation bath solvents include water, ethylene glycol and mixtures of these two. The speed at which the hollow filament is introduced into the coagulation bat can vary depending upon the length of the bath used. Generally, speeds of about 2 to 50 meters per minute, preferably 5 to 28 meters per minute, are utilized with baths which are from 1 to 10 meters, preferably 1 to 5 meters, in length. Thus exposure to the bath should be in the range of about 2 to 10 seconds or longer.

During the coagulation bath treatment step, the hollow filament material is preferably subjected to a drawing operation. The purpose of this drawing operation is to decrease the size of the hollow filament, thereby increasing its surface area per unit volume as well as its strength. Preferably, the spun hollow filament material is drawn at a ratio between 1:1 and 20:1, most preferably between 5:1 and 15:1. The resulting filaments exhibit an inside diameter of about 12 microns to about 500 microns and an outside diameter of 25 microns to about 1000 microns, preferably 25 to 250 microns and 50 to 500 microns respectively.

In a preferred embodiment the preformed polybenzimidazole semipermeable membrane or other article can be chemically modified to form a covalently bonded sulfonated polybenzimidazole material, as disclosed in U.S. patent application Ser. No. 395,648, filed July 6, 1982, the content of which is herein incorporated by reference. To effect this modification, the preformed polybenzimidazole article is sulfonated by contacting the article with $SO_3$ or with any compound which releases $SO_3$. Suitable sulfonating agents include sulfuric acid, complexes of $SO_3$ with a Lewis base or other organic compound, and covalent compounds of the general formula X—$SO_3$H.

Preferred Lewis bases from which the $SO_3$ complexes can be formed include pyridine, trimethylamine, dioxane, triethylamine, diethylaniline, trioxane, quinoline, dimethylformamide, triethylphosphate, and N-ethylmorpholine. Other Lewis bases include 2-methylpyridine, 2,6-dimethylpyridine, dimethylaniline, N-methylmorpholine, N-butylmorpholine, dimethylacetamide, tri-n-propylamine, tri-n-butylamine, triethylamine, and N,N-dimethylbenzylamine. Additional Lewis bases include tertiary amides, ethers, and thioethers.

Miscellaneous organic $SO_3$ complexes include the complexes of pentamethylguanidine, poly(2-vinylpyridine), N-methylacetanilide, N,N-dimethyl-4-toluenesulfonamide, tetramethylurea, N,N-dimethylurethane, formylmorpholide, tetramethyladipamide, N,N-dimethylbenzamide, N-alkyl ethylene carbamate, dimethylcyanamide, trimethylphosphine oxide, diethyl ether, bis(2-chloroethyl)ether, diethyl sulfide, tetrahydrofuran, acetone, anthraquinone, polycyclic mono- and diketones (benzanthrone, benzonaphthone, etc.), 2,6-dimethyl-$\gamma$-pyrone, nitromethane, dimethyl sulfone, sulfolane, and dimethyl sulfoxide.

The covalent compounds of the general formula X—$SO_3$H include acyl sulfates, such as acetyl sulfate, where X=$CH_3CO_2$, and the analogous compounds propionyl sulfate, butyryl sulfate, 3-methylbutyryl sulfate, and benzoyl sulfate. Also included are alkyl sulfates, such as dimethyl sulfate.

The covalent compounds also include halosulfonic acids, such as chloro-, fluoro-, and bromosulfonic acids, where X is Cl, F, and Br, respectively, chlorosulfonic acid being preferred. Also included is sulfamic acid, where X=$NH_2$. Organic sulfonic acids may also be used as sulfonating agents.

As used herein, the term "sulfonating agent" includes mixtures of the above-identified compounds and complexes.

When an asymmetric semipermeable membrane, that is, a membrane having a thick skin superimposed upon a porous support layer, is contacted with a strong sulfonating agent, such as sulfuric acid, it is possible that the strong sulfonating agent may deleteriously affect the structure of the asymmetric membrane. Therefore, it is preferred that asymmetric membranes be sulfonated by contacting such membranes with a relatively mild sulfonating agent, such as the complexes of $SO_3$ with a Lewis base or the covalent compounds of the general formula X—$SO_3$H.

The preformed polybenzimidazole article is contacted with one of the sulfonating agents described above at a temperature within the range of approximately 5° C. to 100° C. The contacting temperature is preferably within the range of approximately 20° C. to 50° C., and is most preferably within the range of approximately 20° C. to 30° C.

Because a preformed membrane readily undergoes sulfonation upon contact with the sulfonating agent, the contact time may be short, e.g., approximately 30 minutes. Preferably, the article is contacted with the sulfonating agent for a period of time within the range of approximately 1 to 5 hours, and, more preferably, for a period of time of approximately 2 hours. Although the sulfonation reaction is essentially instantaneous, the contact times given above ensure that the reagent penetrates the interior of the membrane or other microporous article.

After the article has been contacted with the sulfonating agent, the article is then heated in an inert atmosphere in order to convert the ionic bonds formed during the contacting step to permanent, covalent bonds, thereby providing a covalently bonded sulfonated polybenzimidazole article. The inert atmosphere may be any of a number of non-oxidizing gases, such as nitrogen, argon, etc. The inert atmosphere is preferably nitrogen.

The temperature at which the sulfonated polybenzimidazole article is heated can be any temperature which is sufficient to convert the ionic bonds to permanent, covalent bonds. Preferably, the membrane is heated at a temperature of at least approximately 400° C. and, more preferably, at a temperature within the range of approximately 450° C. to 510° C.

Likewise, the time for which the sulfonated article is heated can be any time which is sufficient, at the temperature employed, to convert the ionic bonds to permanent, covalent bonds. For example, at the preferred temperatures, a period of time of at least approximately 5 seconds is preferred. More preferably, the article is heated for a period of time within the range of approximately 8 to 30 seconds.

The covalently bonded sulfonated polybenzimidazole semipermeable membranes produced in accordance with the process of the present invention exhibit improved separatory capabilities. For example, the sulfonated polybenzimidazole semipermeable membranes exhibit cation selectivity. Such membranes are of particular utility in electrodialysis and other electrochemical applications. The polybenzimidazole semipermeable membranes chemically modified in accordance with the process of the present invention may also exhibit increased water flux for reverse osmosis purposes. The chemically modified polybenzimidazole semipermeable membranes may also exhibit increased resistance to fouling, and hence longer lifetimes.

The separatory capabilities of the covalently bonded sulfonated polybenzimidazole semipermeable membranes produced in accordance with the process of the present invention can be improved still further by higher degrees of sulfonation which may be achieved by reheating the membranes of the present invention one or more times. However, for most purposes, a single contacting/heating sequence is sufficient to produce membranes exhibiting desirable separatory capabilities.

The polybenzimidazole material which is to be made electrically conductive in accordance with the present invention is cuprous ion-impregnated by contact with a source of cuprous ions in a solution. Cuprous ions have been found capable of dispersing into the material more readily and more completely than cupric ions or elemental copper.

Elemental copper cannot be incorporated into the fibrous material except by physical entrapment or plating. By analysis of X-Ray Absorption Near Edge Spectra, an analytical method capable of distinguishing between cupric and cuprous ions, it has been determined that the copper species in the treated fibers is substantially cuprous. While not wishing to be bound by theory, it appears that the cuprous ions are preferentially complexed by the polybenzimidazole material, since hydroxylamine is a moderate reducing agent and reduces only about 1 percent of the cupric ions in solution at any given time, but the final proportion of the cuprous ions in the fibrous material is much higher than would be predicted by their concentration in the treatment solution. The solvent for the cuprous ion solution may be water, or nonaqueous media such as acetonitrile, propylene carbonate or butyrolacetone. In a preferred embodiment, an aqueous solution is employed.

Inasmuch as commercially available cuprous compounds (e.g., cuprous chloride, cuprous cyanide, cuprous iodide) are insoluble in water, the cuprous ions are preferably supplied by in situ reduction of cupric ions. In a preferred embodiment, cupric ions are supplied in a reducing agent-containing aqueous solution in the form of a water-soluble cupric salt such as cupric sulfate, cupric chloride, cupric nitrate, cupric acetate, cupric formate, cupric bromide, cupric perchlorate, complex salts of copper and the like, and mixtures thereof, such that reduction of cupric ions to cuprous ions occurs in solution. In a most preferred embodiment, the source of cupric ions is supplied as cupric sulfate in an aqueous solution.

The cupric salt is supplied in a solution at a concentration sufficient to produce a cupric ion concentration of approximately 0.25 to 10 percent by weight, based on total weight of the solution. In a preferred embodiment, the cupric salt is supplied at a concentration sufficient to produce a cupric ion concentration of approximately 1 to 5 percent by weight based on total weight of the solution. In a most preferred embodiment or good conductivity and physical properties, the solution comprises about 2 percent by weight of the cupric ions. The conductivity of the fibrous material treated generally varies with the concentration of the cupric ion in solution and available for reduction, but at the higher concentrations of cupric ion, the advantage of higher conductivity may be offset by mechanical deterioration of the fibers due to overimpregnation.

A reducing agent is supplied with the cupric ion source to reduce cupric ions to cuprous ions in solution. Preferably, the reducing agent is hydroxylamine, or an hydroxylamine addition salt, e.g., hydroxylamine sulfate, hydroxylamine hydrochloride, hydroxylamine nitrate, hydroxylamine acetate, hydroxylamine formate, hydroxylamine bromide, and the like, and mixtures thereof, with the most preferred reducing agent being hydroxylamine sulfate. However, other salts such as sodium hypophosphite, sodium bisulfite, sodium dithionite, sodium formaldehyde sulfoxylate, zinc formaldehyde sulfoxylate, and mixtures thereof can also be used. The latter two salts are available commercially from Virginia Chemicals Co. under the trademarks Discolite and Parolite, respectively. Copper metal can also be used as the reducing agent, in forms such as powder, turnings, wire or other finely divided materials.

The soluble reducing agent (i.e., other than copper metal) is supplied in an amount which is soluble in the cupric ion-containing solution and which is sufficient to substantially completely reduce the cupric ions present to the cuprous oxidation state. The concentration for the reducing agent in th solution will generally range from approximately 0.1 to 20 percent by weight of active ingredient (e.g., hydroxylamine) based on the total solution weight. In a preferred embodiment, the reducing agent is present in the solution as between about 0.5 and about 10 percent by weight of the solution based on the total solution weight. In a most preferred embodiment, the reducing agent comprises about 5 percent by weight of the solution. When copper metal is used as the reducing agent, it need only be present in a quantity at least sufficient to substantially completely reduce the cupric ions present to the cuprous oxidation state, and is preferably present in a slight excess.

The pH of the solution may be controlled at approximately 1 to 5 by the addition of sulfuric acid, hydrochloric acid, nitric acid, acetic acid or other acids, and sodium hydroxide, potassium hydroxide or other bases to the solution. Control of the pH can be achieved by buffering agents such as potassium hydrogen phthalate, citrate, tartrate, and the like.

The temperature of the cuprous ion-containing solution is preferably elevated (e.g., above about 60° C.). In a preferred embodiment, the temperature of the aqueous solution during the cuprous ion-impregnating step is between about 80° and about 105° C. at atmospheric pressure. In a most preferred embodiment, the temperature of the aqueous solution is about 100° C. Higher temperatures, e.g., in the range of from about 100° to about 150° C., can be used in high pressure equipment such as pressure dyeing equipment, and in steam-heated ovens. Long filaments, tow or roving can also be treated continuously in a steam oven. Elevated temperatures are expected to shorten the duration of treatment.

Contact time between the polybenzimidazole shaped article (e.g., film or fibrous material) and the cuprous ion-containing solution in the cuprous ion-impregnating step may be between about 5 minutes and about 10 hours in duration. In a preferred embodiment, the contact is between about 15 minutes and about 2 hours in duration. During such contact, the polybenzimidazole film or fibrous material is preferably maintained at a constant length but the film or fibrous material can be free to shrink. The required contact between the polybenzimidazole film or fibrous material and the cuprous ion-containing solution can be accomplished by a variety of techniques including immersion, spraying, drip feeding, padding, etc. In small quantities, loose hanks of filaments or tow can be immersed in the solution, while in larger quantities, it is convenient to wind the filaments loosely on a bobbin which can be immersed and gently rotated in a tank of the solution. In a preferred embodiment, a continuous length of the fibrous material can be passed in the direction of its length through a bath containing the cuprous ion-containing solution which is continuously or intermittently replenished, passed through a zone where the solution is applied by spraying, padding, or drip feeding.

After the cuprous ion-impregnating step, the polybenzimidazole fibrous material or other porous material comprises cuprous ions dispersed substantially uniformly throughout the fibrous material. This fact is evidenced by elemental mapping using the characteristic X-ray emission in an electron microscope. However, the uniform penetration an distribution of cuprous ions throughout the fibrous material is not essential, as the desired conductivity may in some cases be achieved by cuprous ion-impregnation which is limited to surface areas. If a relatively low concentration of the cuprous ions in the fibrous material is desired, e.g., for production of low conductivity fibers, the material may optionally be washed prior to contact with the sulfiding agent.

After the cuprous ion-impregnating step, the cuprous ion-impregnated polybenzimidazole material is contacted with a sulfiding agent which is capable of sulfiding cuprous ions to form electrically conductive copper sulfide in association with the polybenzimidazole material. Suitable sulfiding agents include sodium thiosulfate, potassium thiosulfate, lithium thiosulfate, rubidium thiosulfate, cesium thiosulfate, sodium sulfide, sulfur dioxide, sodium hydrogen sulfite, sodium pyrosulfite, sulfurous acid, dithionous acid, sodium dithionite, thiourea dioxide, hydrogen sulfide, sodium formaldehyde sulfoxylate, and zinc formaldehyde sulfoxylate and the like, or mixtures thereof. The preferred sulfiding agents are the alkali metal thiosulfates. Some of these agents, such as, e.g., sodium hydrogen sulfite, sodium dithionite, sodium formaldehyde sulfoxylate, zinc formaldehyde sulfoxylate, and mixtures thereof can serve as combination reducing and sulfiding agents. The most preferred sulfiding agent at present is sodium thiosulfate.

The sulfiding agent is preferably contacted with the cuprous ion-impregnated polybenzimidazole material by addition of the sulfiding agent directly to the cuprous ion-containing solution. The contact occurs for an additional time period of between about 15 minutes and about 10 hours. In a preferred embodiment, the additional contact is between about 1 and about 2 hours in duration. During such contact, the polybenzimidazole material is preferably maintained at a constant length but can be free to shrink. Again, the required contact between the cuprous ion-impregnated polybenzimidazole material and the sulfiding agent-containing solution may be accomplished by a variety of techniques including immersion, spraying, drip feeding, padding, etc. In a preferred embodiment, a continuous length of the polybenzimidazole material is again passed in the direction of its length through a bath containing the sulfiding agent-containing solution which is continuously or intermittently replenished.

In an embodiment, a solution of a copper thiosulfate complex chilled to a temperature where it is homogeneous (e.g., 0°-5° C.) is applied to the fibrous material, then precipitates copper sulfide when the material is warmed to at least about room temperature.

The sulfiding agent comprises between about 0.1 and about 30 percent by weight of the solution which is contacted with the cuprous ion-impregnated material, based on total solution weight. Preferably, the solution comprises between about 5 and about 15 percent by weight of the sulfiding agent. Most preferably, the solution comprises about 10 percent by weight of the sulfiding agent, based on total solution weight. Typically, low concentrations of the sulfiding agent are used in conjunction with low cuprous ion concentrations so as to convert all or most of the cuprous ion to copper sulfide.

Preferably, the aqueous solution comprising the sulfiding agent is again maintained at an elevated temperature, e g., between about 90° and about 105° C. Most preferably, the aqueous solution is maintained at about 100° C. Higher temperatures, preferably at superatmospheric pressure, can be used to accelerate the treatment. At present, the highest conductivities are obtained in an embodiment in which the cuprous solution is cooled, e.g., to a temperature of about 80° C., a sulfiding agent such as a thiosulfate is added, and the temperature of the solution is then gradually raised, e.g., to the range of about 100°-103° C.

Following the sulfiding treatment, the resulting material is preferably washed to remove residual reactants adhering thereto, and dried. Washing may be achieved by rubbing or agitating in a tank or under running water, spraying with a jet of water, and the like. Drying may be accomplished by hot air, superheated steam or vacuum drying. The post-sulfiding treatment steps of washing and drying are designed to remove soluble, excess copper salts, sulfiding agents, etc. It is also desirable to free the fibers as much as is practicable of powder copper sulfides precipitated in solution.

After the sulfiding treatment, substantially all of the copper ions are sulfided. In a preferred embodiment, at least about 80 percent, and preferably between about 90 and essentially about 100 percent of the sulfided copper (i.e., copper sulfide) is in the covellite form, with the remainder being in the form of digenite, having the empirical formula $Cu_9S_5$. In a most preferred embodiment, the copper sulfide is substantially and entirely (e.g., at least 97 percent) in the covellite form. Preferably, the resulting copper sulfide consists essentially of covellite copper sulfide.

By the term "covellite" is meant copper sulfide of a stoichiometric formula CuS, with a crystallographic structure identical to that of the copper sulfide mineral covellite of the same stoichiometry. The crystal structure is described by R. W. G. Wyckoff in CRYSTAL STRUCTURES, 2d Ed., Vol. I, R. E. Krieger Publ. Co. (1982), at page 145, which is herein incorporated by reference. Contrary to expectation, the copper is not in the cupric (divalent) state and all the copper and sulfur atoms are not equivalent. The structure is hexagonal with an elongated six molecule cell; $a_o = 3.796$ Å and $c = 16.36$ Å. Of the six sulfur atoms per unit cell, four are associated to two $S_2$ groups (S—S: 2.05 Å); two of the six copper atoms have triangular coordination (CuS: 2.19 Å) and the other four have tetrahedral coordination (Cu-S : 2.31 Å). All the copper is reduced to Cu+ and CuS is diamagnetic. The monosulfide is a metallic conductor at room temperature and is superconducting below 1.62° K.

It is highly desirable that the copper sulfide is in the covellite form, as covellite is the most highly electrically conductive known form of copper sulfide. The chemical structure of the copper sulfide can be verified by X-ray diffraction techniques.

Figure 8:
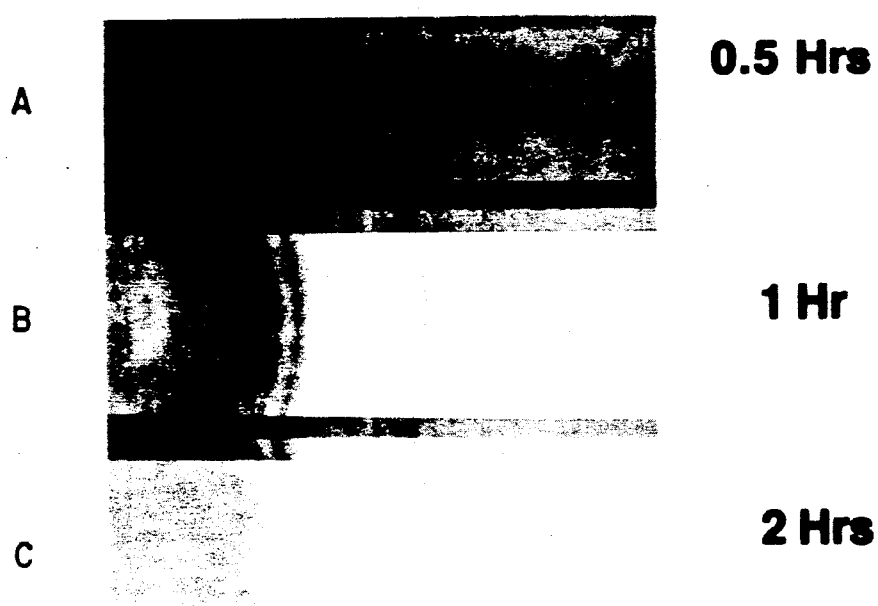
FIG. 8 is a set of X-ray diffraction patterns of the electrically conductive polybenzimidazole fibrous material produced in accordance with the procedure of Example II, showing the covellite copper sulfide phase in a Debye-Scherrer pattern.

FIG. 8 is a set of X-ray diffraction patterns of an electrically conductive polybenzimidazole fibrous material produced in accordance with the procedure of Example II, and shows the covellite copper phase in a Debye-Scherrer pattern. The pattern was identified as that of covellite by a computer search of JCPDS files, correlating with JCPDS card 6-464. (The JCPDS card for digenite is card 23-962.) The proportion of covellite produced can be affected by the duration of the sulfiding treatment; for example, after the fiber has soaked in cuprous ion solution for 1 hour mixtures of covellite and digenite can be observed after sulfiding for one half, FIG. 8(a), or 1 hour, FIG. 8(b), but only covellite is observed after 2 hours of sulfiding (FIG. 8(c)). While not wishing to be bound by theory, observations of trials thus far are consistent with a mechanism wherein both covellite and digenite phases are formed initially, with the progressive conversion of the digenite phase to the covellite phase.

Figure 2:
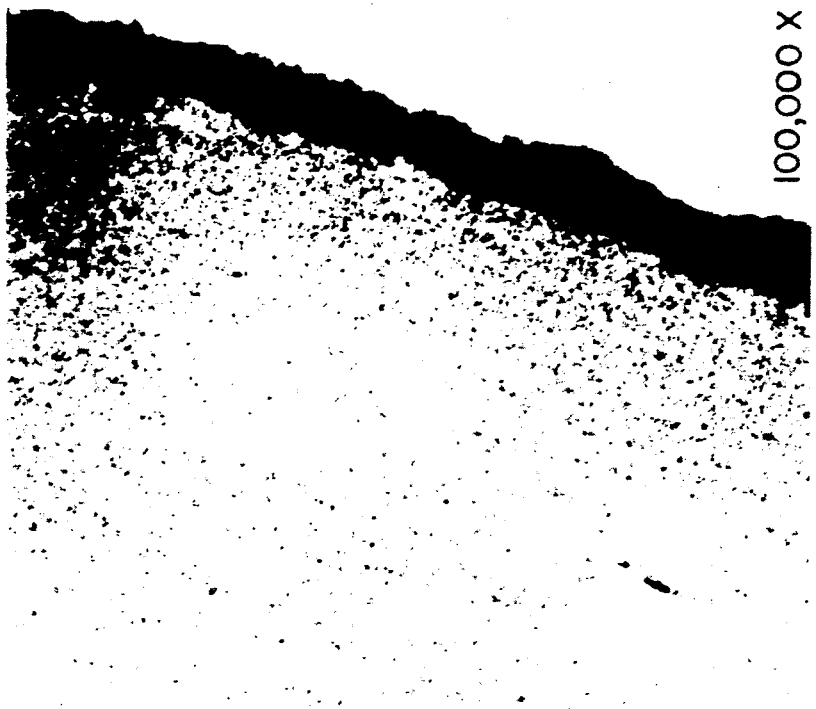
FIG. 2 is a transmission electron micrograph (100,000X) of a thin cross-section of a sample of conductive bilobal polybenzimidazole fiber associated with covellite copper sulfide, showing a contiguous surface coating of the copper sulfide with considerable penetration.

With respect to the physical configuration of the copper sulfide relative to the polybenzimidazole fibrous material, during the sulfiding step, most of the copper sulfide appears to precipitate out of the fibrous material and to form in association with the polybenzimidazole material a solid layer of copper sulfide having a thickness of approximately 0.05 to 2 microns (preferably 0.1 to 0.2 microns) at the surface of the polybenzimidazole material (see FIG. 2). Studies of the cuprous ion-impregnated fibers by elemental mapping of the copper and sulfur using wavelength dispersive analysis and back-scattered electron imaging revealed that the copper ions are distributed throughout the fiber rather than being restricted to the surface. However, examination of the fibers after completion of the sulfidation step showed a sulfide layer of less than 0.4 micron thickness on the fiber surface, with some residual copper and sulfur in the fiber matrix. While not wishing to be bound by theory, it is believed that the consolidation of most of the CuS as formed at the fiber surface is responsible for the high conductivity observed in the fibers. Also, it is believed that the precipitation of CuS by migration of the copper ions from within the polymer material rather than by mere "coating" from the solution phase accounts for the good adhesion of this inorganic phase which has been observed. By the phrase "in association with the polybenzimidazole material" it is meant that the copper sulfide is substantially and entirely in direct contact with the polybenzimidazole material, i.e., either on the surface of the polybenzimidazole material, dispersed within the polybenzimidazole material, or a combination thereof. Preferably, the covellite copper sulfide is primarily on the surface of the polybenzimidazole material. In a preferred embodiment, the covellite copper sulfide forms a substantially continuous coating on the outside of the fibrous material, and penetrates the fiber surface to at least about 1 micron depth, as indicated by electron microscope studies. The coating covers all the recesses and protrusions on the substrate fiber surface, and is typically about 0.05-1 micron thick, although no contiguous coating is observable in fibers of very low conductivity. The application of coatings of excessive thickness would probably lead to exfoliation, which could have the undesirable effect of reducing the flexibility of the fibers. The coating appears to be continuous (FIG. 1) and the resulting polybenzimidazole material is ductile and heat stable up to approximately 300° C.

The polybenzimidazole film or fibrous material preferably comprises between about 5 and 60 percent by weight of the covellite copper sulfide, based on total weight of polybenzimidazole material and copper sulfide, i.e., the total weight of the product. In preferred embodiments, the covellite copper sulfide comprises between about 5 and about 15 percent or between about 25 and about 35, or between about 35 and about 60 percent of the total weight.

Various techniques can be used to control the amount of copper sulfide deposited in the polybenzimidazole material, and the proportion of the desired highly conductive covellite phase, including the concentrations of the cuprous ion and sulfiding solutions, temperatures and the times of contact with the solutions. For example, the highest concentrations of copper sulfide of the covellite phase are obtained when cuprous ions are present in solution as the material is contacted with th sulfiding solution, while the concentration can be reduced by washing the material before contact with the sulfiding solution.

The resulting polybenzimidazole material exhibits electrical conductivity of the metallic type, i.e., conductivity measurements decrease linearly as temperature increases. At 25° C., the electrical conductivity commonly is between about 0.001 and about 1000 ohm$^{-1}$cm$^{-1}$ in the direction of its fiber length, and preferably between about 100 and about 1000 ohm$^{-1}$cm$^{-1}$. In a most preferred embodiment, in the case of polybenzimidazole fibers, the fibrous material exhibits an electrical conductivity of between about 500 and about 1000 ohm$^{-1}$cm$^{-1}$ in the direction of its fiber length at 25° C. The electrical conductivity conveniently was determined by measuring the resistance of the multifilament tow by using an ohmmeter, as well as by mounting individual fibers, attaching conducting adhesive contacts to them and measuring their resistance by both 2-point and 4-point methods.

The electrically conductive polybenzimidazole fibrous material is washed after the sulfiding step to remove excess reactants, which could otherwise affect the stability of the polybenzimidazole or polymers used to form a matrix surrounding the fibers. The presence of excess reactants particularly affects stability at elevated temperatures.

Following washing and drying, the electrically conductive polybenzimidazole shaped articles can be used while in a variety of physical configurations. For example, filaments or fibers prepared in accordance with the present invention can be used alone or mingled with non-electrically conductive synthetic or natural fibers to form sheetlike articles having at least one layer comprising a multiplicity of conductive fibers, e.g., electrically conductive fabrics or papers suitable for electrical heating tapes, electrostatic dissipation or shielding from electromagnetic radiation. Alternatively, yarns prepared according to the present invention may be used in preparing antistatic carpeting and the like.

Much like the individual fibers of the fibrous material, the woven or non-woven fabrics or papers incorporating the conductive fibrous material, optionally in combination with non-conductive synthetic or natural fibers, can have conductivity values in the range of from about 0.001 to about 1000 ohm$^{-1}$cm$^{-1}$, preferably in the range of from about 1 to about 500 ohm$^{-1}$cm$^{-1}$.

Alternatively, the conductive properties of sheet materials, including the polybenzimidazole films, can be expressed as sheet resistivity, with the materials generally having sheet resistivity values in the range of from about 1 to about 1000 ohms/square, preferably, from about 100 to about 1000 ohms/square. The sheet resistivity of a material is the ratio of the potential gradient parallel to the current along the material to the current per unit width of the surface, and is numerically equal to the resistance between two electrodes forming opposite sides of a square, the size of which is immaterial. Sheet resistivity can be measured by methods comparable to those described for the measurement of surface resistivity of insulating materials in ASTM D-257-78 (as reapproved in 1983). For example, conductive papers with sheet resistivity in the range of from about 300 to about 1000 ohms/square are useful in impedance matching layers for absorption of electromagnetic radiation, and high conductivity papers with sheet resistivity in the range of from about 0.1 to about 10 ohms/square are useful in electrical shielding and grounding applications.

In a preferred embodiment, polybenzimidazole film material is (a) contacted with an aqueous solution containing copper ions in a concentration of about 1% by weight in the presence of 0.5% to 1% by weight of hydroxylamine, with the percentages by weight being based upon the total weight of the solution, for 0.5 to 1 hour; and (b) the cuprous ion-impregnated polybenzimidazole film is contacted with a thiosulfate, e.g., sodium thiosulfate, for about 1 to 2 hours. In the present process for preparing electrically conductive polybenzimidazole film, the final weight increase due to deposited copper sulfide will be a function of the thickness of the film, i.e., the thinner the film, the lighter the weight of the film, and the higher the final percentage of weight increase. Typically, the resistance of polybenzimidazole film rendered electrically conductive by the present process is between about 2.5 and 30 ohms/square.

In another preferred embodiment, the electrically conductive fibrous material may be incorporated into a substantially continuous resinous or polymeric matrix comprising at least one polymer selected from the group consisting of thermosetting polymers, thermoplastic polymers, and natural rubbers to produce compositions which ar useful for various purposes, e.g., forming into a monolithic electrically conductive composite article. The polymeric matrix can be flexible, rigid, elastomeric or pliable when cured or solidified. The composite article fabrication technique can be selected from any of those procedures previously employed in the advanced engineering composites art. For instance, tows, layers, ribbons, plies, fabrics, papers, etc. of the electrically conductive polybenzimidazole fibrous material while in the desired physical configuration may be impregnated with an uncured thermosetting resin, stacked on top of each other, and cured under pressure at an elevated temperature to form a composite article wherein the cured thermoset resin serves as a solid continuous matrix phase. Alternatively, the electrically conductive polybenzimidazole fibrous material may be provided in the matrix material as relatively short length (e.g., approximately 1/16 to 1 inch in length) fibers in a relatively random configuration. In a preferred embodiment, the fibrous material is provided in short lengths of between approximately ¼ and ½ inches. Since the electrically conductive polybenzimidazole fibrous material can withstand the elevated temperatures up to approximately 300° C. involved in mixing and molding processes without deleterious results, molten thermoplastic matrix-forming resins can be likewise employed.

The various polymeric matrices into which the conductive polybenzimidazole fibrous materials are incorporated can also include wetting agents, fire retardants, curing agents, reinforcing agents such as glass fibers or fillers such as silica. The fibrous materials can be coated with sizing to control their volume on chopping, as is commonly done in chopping carbon fibers.

In another preferred embodiment, the electrically conductive polybenzimidazole fibrous material ca be incorporated into polymeric compositions useful as molding compositions liquid mixtures which can be cast and cured into composite articles or liquid mixtures, melts or solutions suitable for use as electrically conductive coatings. The coatings or other polymeric compositions can be cured by any suitable means, including chemical curing or cross-linking agents, thermal cures, ultraviolet light or other electromagnetic radiation, either ionizing or nonionizing.

Conductive polymeric compositions have previously been prepared by incorporating conductive particulate materials such as electroconductive carbon black or metals into a polymeric substrate, but the conductivity is limited by the volume of the particles which can be blended into the polymer without degrading its physical properties excessively. It has been found that fibrous materials, having a higher aspect ratio, can be blended into polymers in high weight proportions without causing such degradation, and furthermore are more effective in providing a conducting network due to their longitudinal dimensions. Thus, the effectiveness of fibrous materials such as carbon fibers can be measured by the volume percent incorporated into a polymeric substrate, although the cost of the materials will normally be based upon weight percent. Carbon fibers can be used to produce conductive polymeric compositions, but are expensive so that they are used only when such fibers are also needed to provide reinforcement for the material.

The polybenzimidazole fibrous material with copper sulfide associated therewith prepared in accordance with the present invention offers the advantage of fibers which can be made at least as conductive as carbon fibers at less cost, and used to produce a variety of conductive composite materials. Surprisingly, the fibers of the present invention are found to be resistant to physical breakdown when subjected to high temperature mixing processes, and thus can be used in compounding thermoplastic molding compositions without sacrificing conductivity.

Examples of suitable thermosetting polymeric materials, often referred to as engineering resins, into which the electrically conductive polybenzimidazole fibrous material may be incorporated include epoxy resins such as epoxy esters, silicone resins, polyester resins, melamine resins, phenolic resins, polyimide resins, and mixtures thereof. Preferred thermosetting resinous materials include various epoxy and phenolic resins. A preferred monolithic electrically conductive composite article comprises polybenzimidazole fibrous material in association with approximately 35 to 60 percent by weight of covellite copper sulfide incorporated with a solid, continuous, cured epoxy resin matrix.

Examples of suitable thermoplastic polymeric materials, also referred to as engineering resins, into which the electrically conductive polybenzimidazole fibrous material may be incorporated include polyolefins such as polyethylene and polypropylene, vinyl polymers such as polystyrene, polyacrylics and polyvinyl chloride; acrylonitrile butadiene styrene (ABS) copolymers, polycarbonates, neoprenes, silicone polymers, polyamides such as various nylons; polyesters, polyphenylene oxide, polyphenylene sulfide, polysulfones, polyether sulfones, polyetherether ketones, polyetherimides, polysilicones, polyurethanes, polyarylates, polyacetals, and mixtures thereof. Preferred thermoplastic polymeric materials include ABS resins, polycarbonates, nylon 6 and nylon-66, polyethylene terephthalate and polybutylene terephthalate.

The admixture of the electrically conductive polybenzimidazole fibrous materials with such polymeric carriers results in polymer compositions suitable for employment in electrically conductive end uses. Such polymer compositions utilizing thermoplastic or thermosetting polymers as the carrier are capable of being molded into electrically conductive molded articles or composites. Thermoplastic molding compositions containing the conductive fibers of the invention can be mixed and pelletized in the conventional manner for use in extrusion molding apparatus and the like.

In addition to admixtures with polymeric carriers, the electrically conductive polybenzimidazole fibrous materials of the present invention can be admixed with liquid monomers, oligomers or prepolymers, or solutions of polymers, which can be cured to solid form by any suitable means. For example, liquid monomers or prepolymers can be cured by the addition of chemical curing agents, catalysts or oxidants, electromagnetic radiation (including visible or ultraviolet light, X-rays, electron beams, gamma rays and the like), or by thermal means. For example, a monomer such as styrene or a substituted styrene can be cured by the addition of a chemical cross-linking agent such as divinylbenzine, and prepolymers such as phenol-formaldehyde resins can be cured by heating. Various monomers, prepolymers and polymers such as polyacrylamides can be cured or cross-linked by radiolytic curing means such as by exposure to gamma rays or electron beams.

In an embodiment, the polymeric carrier of the polymer composition exhibits adhesive characteristics (being selected from suitable polymers such as epoxy polymers, silicone polymers, neoprenes, acrylates, cyanoacrylates, polyurethanes, and the like), making the composition suitable for use as an electrically conductive adhesive composition. In a preferred embodiment, the polymer composition suitable for use in electrically conductive end uses comprises electrically conductive polybenzimidazole fibrous material in association with approximately 5 to 60 weight percent of covellite copper sulfide and a polymeric carrier. In an alternative embodiment, the polymeric carrier is a material such as a silicone polymer or epoxy polymer which retains a pliable or semi-fluid state so that it can be used as an electrically conductive putty, caulking compound, sealant or the like.

In another embodiment, the polymeric carrier is capable of forming a continuous coating and the resulting composition is suitable for use in the formation of a continuous electrically conductive coating on a substrate. For example, the carrier can be a melt of a thermoplastic polymer, a liquid monomer or prepolymer which can be cured in situ to form a solid coating, or a solution of a thermosetting or thermoplastic polymer which forms a solid coating as the solvent evaporates. The conductive fibers of the present invention can be suspended in coating compositions which are conventional paints, comprising a pigment and the polymer carrier in a solvent or thinner, or an emulsion paint, in which the polymer carrier is present in either a latex formed by emulsion polymerization or as an emulsion of the polymer itself. Such emulsion paints contain the polymeric carrier in a dispersion of water, while the conventional or solvent paints dissolve the polymer in a suitable organic solvent. Such electrically conductive paints, as with the other electrically conductive coating compositions of the invention, can be dried or cured by any suitable means to form a continuous, solid electrically conductive coating In a preferred embodiment, the resinous material prior to solidification is supplied as a liquid, i.e., at temperatures above the melting point, to facilitate ready mixing of the fibrous material therewith.

In addition to these synthetic polymers, the conductive fibers can be incorporated into suitable natural polymers such as natural rubber, which is thermoplastic but can be vulcanized or cured to solid form in various consistencies by the use of conventional curing agents. Synthetic rubbers such as neoprenes can also be used.

After solidification, a monolithic electrically conductive composite article results. The article may be flexible, pliable, elastomeric or relatively rigid depending on the polymeric matrix which is used. By "monolithic" is meant an article exhibiting substantially complete uniformity and which is solid and substantially void-free. In addition to conventional molded or cast articles, the composite article can be extruded or otherwise formed into a sheet having a thickness of approximately 1 mil to 1 inch, or even thicker, if desired, and having a sheet resistivity in the range of from about 1 to about 1000, preferably about 100 to about 1000 ohms/square. The composite article can contain a fabric, paper, or felt which includes the conductive fibers, the fabric, paper, or felt being incorporated within a solid continuous polymeric matrix as by, e.g., impregnation of a fabric with a liquid polymer or monomer which is subsequently cured. In a preferred embodiment, a sheetlike article is provided comprising polybenzimidazole fibrous material in association with from about 5 to about 60 percent by weight of electrically conductive covellite copper sulfide, the sulfide being present in at least one layer comprising a multiplicity of the fibers, and having a thickness of approximately 1 mil to 1 inch, the article having a sheet resistivity in the range of from about 1 to about 1000 ohms/sheet. In another embodiment, the liquid polymer utilized can itself contain additional finely divided electrically conductive polybenzimidazole fibrous material of the present invention, i.e., electrically conductive polybenzimidazole fibrous material in association with approximately 5 to 60 weight percent of covellite copper sulfide.

The composite article commonly comprises between about 0.1 and about 35 percent by volume of the fibrous material, based on the total volume of the composite. In a preferred embodiment, th composite comprises between about 1 and about 10 percent by volume of the fibrous material. In another preferred embodiment, the composite article comprises between about 0.5 and about 2.5 percent by volume of the fibrous material. In a high conductivity embodiment, the composite article comprises from about 10 to about 30 percent by volume of the fibrous material. The polymer compositions used for the production of such composite articles can have corresponding proportions of the fibers.

The electrical conductivity of the composite article is of course, influenced by the conductivity of the fibrous material, the level of loading of the fibrous material and the degree of alignment of the electrically conducting fibers present therein. Generally, the fibers are distributed evenly and aligned in an omnidirectional manner to provide homogeneous electrical properties, but can be aligned in predominantly one direction, e.g., by extrusion of the composite, to provide a higher conductivity in that direction than in others. Generally, the electrical conductivity of such articles is between about $10^{-6}$ ohm$^{-1}$cm$^{-1}$ and about 10 ohm$^{-1}$cm$^{-1}$ at 25° C. when measured in at least one direction. Compositions having conductivities and resistivities in various ranges can be employed for different applications of the present invention. For example, compositions employed for antistatic purposes can have a conductivity in the range of from about $10^{-6}$ to about $10^{-3}$ ohm$^{-1}$cm$^{-1}$ at 25° C., when measured in at least one direction. Compositions intended for EMI shielding preferably have a conductivity in the range of from about 0.1 to about 10 ohm$^{-1}$cm$^{-1}$ at 25° C., when measured in at least one direction.

While these DC resistivity and conductivity values are useful in the preparation of conductive compositions and composites for various purposes, those skilled in the art will recognize that the AC impedance of the compositions and/or structures of which it is a part will need to be considered when the incident radiation is at high frequencies such as radio or microwave frequencies. Compositions prepared according to the present invention are highly effective in producing the appropriate conductivity or resistivity on the surface of objects to allow electromagnetic radiation at radio or microwave frequencies to be absorbed rather than reflected. In contrast, compositions prepared with metal particles are generally too conductive to produce the appropriate surface conductivity. To achieve the desired results, the compositions as applied to the object's surface should at least approximately match the impedance of free space, 377 ohms per square. Compositions which will produce composite articles or surfaces having sheet resistivities in the range of from about 300 to about 500, preferably about 400 ohms/square, are thus preferred for such applications.

The monolithic electrically conductive composite articles produced in accordance with the present invention are suitable for use in various applications requiring electrically conductive materials, especially those requiring highly conductive materials, including EMI shielding and absorption material; flexible microelectronics; electrostatic dissipation material; electrically conductive coatings or paints; pliable sealant material; and electrically conductive adhesives.

The electrically conductive polybenzimidazole films or membranes produced in accordance with the present invention may be used for a variety of gas or liquid separations, such as the transport of polar molecules through a solid film.

The following Examples are given as specific illustrations of the invention. It should be understood, however, that the invention is not limited to the specific details set forth in the Examples.

EXAMPLE I

Fibers of a polybenzimidazole prepared from poly-2,2'-(m-phenylene)-5,5'-bibenzimidazole containing about 200 filaments of about 2 denier per filament (dpf), in unstretched and unsulfonated form, were selected as the initial material to be treated in accordance with the present invention.

A 33 cm length of the 2 dpf, 200 filament was weighed. The 1 3 gram sample was coiled and placed at the bottom of a 600 ml beaker. An aqueous solution of 15 g. $CuSO_4.5H_2O$ and 7.5 g. $(NH_2OH)_2.H_2SO_4$ in 150 ml water, having a pH of 3.3 and containing 2.6 weight percent copper and 2.0 weight percent hydroxylamine, was poured into the beaker. The beaker was then covered and placed in a heating mantle, where it was heated to a temperature of 100° C. in about 15 minutes. The temperature was maintained between 100° and 105° C. for 2 hours. The solution was then allowed to cool to ambient temperature.

A solution of 20 g. $Na_2S_2O_3.5H_2O$ in 50 ml water was then added to the beaker, producing a concentration of 3.1 weight percent thiosulfate ion, and the contents were heated from about 40° C. to 100° C. in 15 minutes. The temperature was maintained between about 100° and 104° C. for 2 hours. The fiber was removed from the beaker and washed repeatedly in cold water, then in hot water, and finally in methanol. The fiber was then dried in a vacuum oven at 65° C. The weight of the fiber increased to 2 g , representing a gain of 55 percent in weight.

The fibrous material produced in Example I was flexible, ductile, and heat stable, and had a resistance of 1500 ohm/cm filament length.

The adhesion of the copper sulfide to the polybenzimidazole fibrous material and the flexibility of the conductive fibers were demonstrated by the lack of cracking and chipping along the periphery of a 0.1 inch diameter loop of a filament observed in an electron microscope. There was no observable peeling or chipping when a filament was fractured. The fracture cross-section did not reveal a clear boundary between the polymer and the copper sulfide, thus interpenetration is believed to be responsible for the remarkable adhesion observed.

The covellite copper sulfide-impregnated fibers thus produced have been found to have a fairly stable resistivity over time, although with fibers of relatively high resistivity, the values may be affected by variations in ambient humidity.

Figure 3:
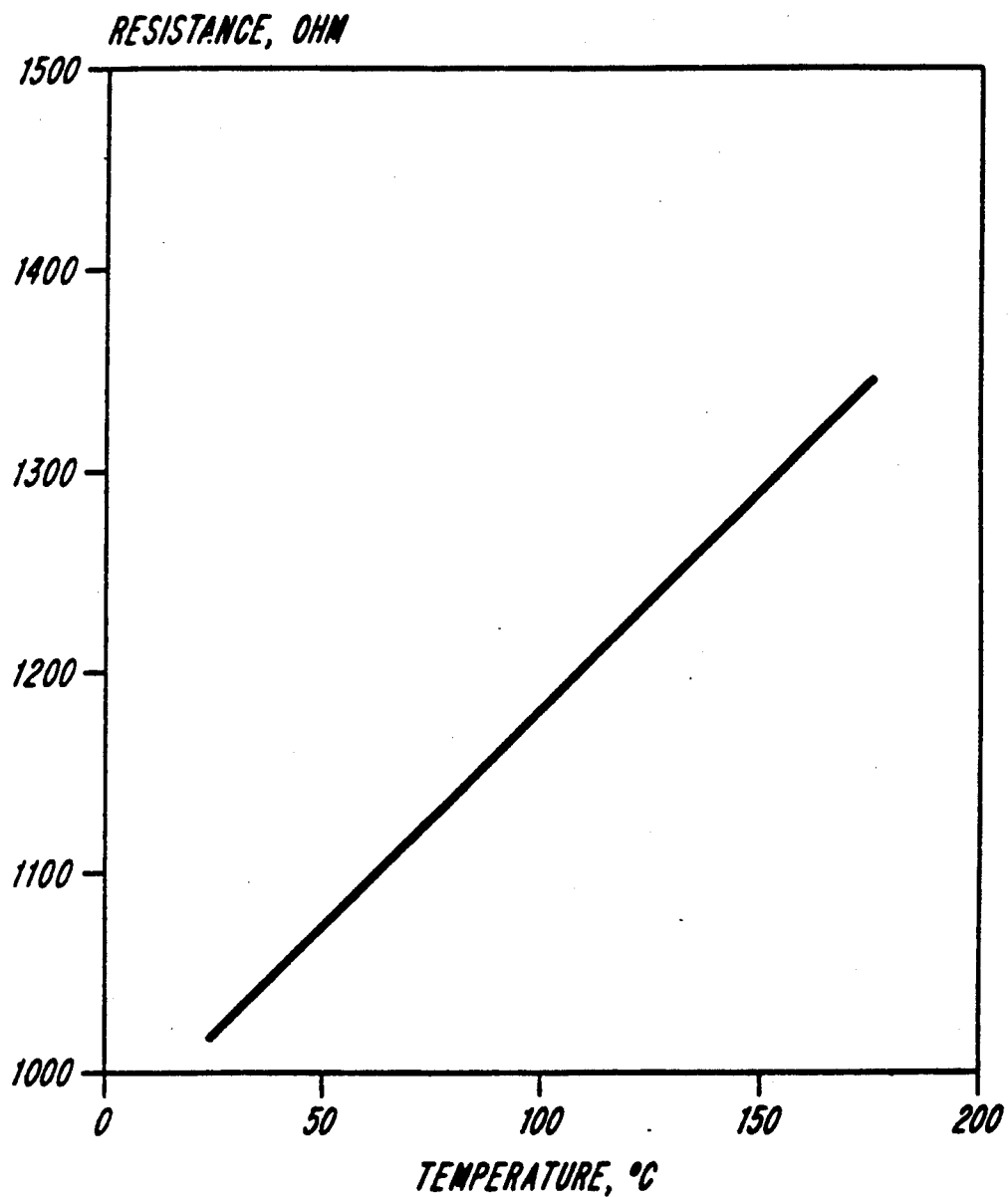
FIG. 3 is a graph of the resistance variation with temperature of an electrically conductive thermally stabilized fibrous material having covellite copper sulfide associated therewith produced by procedures similar to those of Example I.

FIG. 3 shows a plot of the variation of resistance of an individual filament of a covellite copper sulfide-impregnated thermally-stabilized acrylic material with temperature, obtained by monitoring the resistance of a fiber approximately 10 mm long, using an AC current of 0.3 microamperes. A linear resistance LR-400 AC resistance bridge was used for monitoring resistance at various temperatures during heating up and cooling down of the fiber. Resistance increases linearly with temperature, demonstrating that the conductivity is metallic in nature and the material is stable up to at least about 170° C. Polybenzimidazole fibers are expected to exhibit similar resistance properties, and to be stable to even higher temperatures, since polybenzimidazoles are normally stable up to over 300° C.

The average resistivity of the fiber was calculated by multiplying the observed resistance by the fiber cross-sectional area, and the fiber cross-sectional area was calculated from the denier and density of the sample.

EXAMPLE II

(a) Treating with Cuprous Ions

A 2 dpf, 6000 filament tow of poly-2,2'-(m-phenylene)-5,5'-bibenzimidazole was immersed in an aqueous solution containing 2.6 weight percent copper and 2.0 weight percent hydroxylamine at 100° C. for three hours; the percent weight increase of the tow was measured after one, two and three hours. The results are tabulated in Table 1.

Polybenzimidazole film was immersed in an identical aqueous solution at 100° C. for three hours; the percent weight increase of the film was also measured at one, two, and three hours. The results are also tabulated in Table 1.

TABLE 1

| Percent Weight Increase Upon Treatment With Cuprous Ions | | |
|---|---|---|
| Hours | Polybenzimidazole Tow | Polybenzimidazole Film |
| 0 | 0 | 0 |
| 1 | 37.2 | 26.0 |
| 2 | 34.1 | 22.8 |
| 3 | 29.6 | 22.6 |

Figure 4:
FIG. 4 is a transmission electron micrograph (4000X) of polybenzimidazole fiber after one hour treatment with cuprous ions.
Figure 5:
FIG. 5 is an X-ray map for copper of polybenzimidazole fiber after one hour treatment with cuprous ions.

The resistance of the tow following treatment with cuprous ions was high and not measurable with an ohmmeter, i.e., greater than $2 \times 10^7$ ohms/cm. As shown by FIG. 4, a transmission electron micrograph at 4000X after treatment with cuprous ions for one hour the surfaces of the fibers of the tow was as smooth as that of untreated or virgin polybenzimidazole fiber. Elemental mapping by recording the X-ray radiation emitted by copper (FIG. 5) showed uniform distribution of copper throughout the fiber body.

(b) Sulfiding

After treatment with cuprous ions for one hour as described in subpart (a), the tow and film samples were treated in a solution containing 3.1 weight percent of thiosulfate. The weight increases of the tow and film were measured after 0.5, 1 and 2 hours. The results are tabulated in Table 2.

TABLE 2

Percent Weight Increase Upon Sulfiding

| Hours | Polybenzimidazole Tow | Polybenzimidazole Film |
| --- | --- | --- |
| 0 | 0 | 0 |
| 0.5 | 56 | 34 |
| 1 | 62 | 32 |
| 2 | 54 | 35 |

The resistance of the tow was also measured after 0.5, 1, and 2 hours of sulfiding. The resistance measurements of the tow used an ohmmeter. Single filaments were mounted on substrates using graphite-based conducting paste contacts. Both 2- and 6- terminal resistance measurements were made. The results are tabulated in Table 3.

TABLE 3

Resistance Measurements of the Tow Upon Sulfiding

| | Sulfiding Duration (hrs) | | |
| --- | --- | --- | --- |
| | 0.5 | 1 | 2 |
| Resistance of 20 cm long tow ($\Omega$) | 16.2 | 14.3 | 33.6 |
| Resistance of single filament of tow (calculated) ($\Omega$) | 4860 | 4290 | 10,080 |
| Lowest single filament resistance measured ($\Omega$) | 1552 | 3024 | 1500 |
| Resistivity (calculated) ($\Omega \cdot cm$) | $3.52 \times 10^{-3}$ | $6.86 \times 10^{-3}$ | $3.40 \times 10^{-3}$ |
| Conductivity (S/cm) | 284 | 146 | 294 |

The decrease in weight pick-up and increase in resistance shown for the fibers in Tables 2 and 3, respectively, is believed to be due to the slough-off of some of the coating at long duration of sulfiding.

Figure 6:
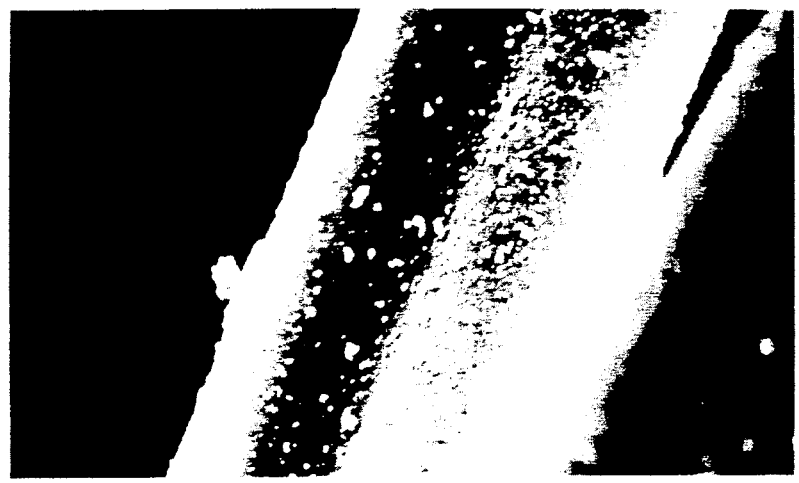
FIG. 6 is a transmission electron micrograph (2000X) of polybenzimidazole fiber after sulfiding for one hour.

FIG. 6 is a transmission electron micrograph (2000X) of the fiber surface after sulfiding for one hour. It depicts the continuous smooth coating of copper sulfide on the surface with some adhering particulates.

Figure 7:
FIG. 7 is an X-ray map for copper of polybenzimidazole fiber after one hour of sulfiding.

FIG. 7 is an X-ray map for copper showing accumulation of copper at the surface of the fiber after sulfiding for one hour. FIG. 1 is a transmission electron micrograph (10,000X) of a thin cross-section of fiber after 0.5 hour of sulfiding showing that the fiber had developed a dense, uniform, and continuous coating about 1.0$\mu$m thick of copper sulfide about the periphery of the fiber. FIG. 2 is a transmission electron micrograph (100,000X) of a thin cross-section of fiber after 1 hour of sulfiding.

FIG. 8 is a set of three X-ray diffraction patterns of the fibers showing the progressive conversion of the digenite phase to the covellite phase as sulfiding duration increases. FIG. 8(a), at 0.5 hours of sulfiding, shows both digenite and covellite phases being present. After 1 hour of sulfiding, FIG. 8(b) shows the fading of the lines due to digenite phase with an accompanying increase in the relative intensity of the lines due to covellite. At the end of 2 hours of sulfiding (FIG. 8(c)) lines due to digenite are absent; only lines due to covellite are seen.

While not desirous of being bound by any particular theory, the results of the X-ray diffraction and the electron microscopy studies appear to support the hypothesis that the copper ions are incorporated into the polybenzimidazole material by the formation of complexes with the polymer, probably with some of the nitrogen atoms in the polymer molecules.

EXAMPLE III

Heat-treated polybenzimidazole staple fibers were prepared from poly-2,2'-(m-phenylene)-5,5'-bibenzimidazole and sulfonated in accordance with the teachings of U.S. patent application Ser. No. 395,648 filed July 6, 1982. These staple fibers were then spun into 28/2 yarn. A 2×1 twill fabric of 8.4 oz./sq. yd. was woven from the yarn. A 10" square sample of this fabric was placed in a 2 liter stainless steel dye tube. The dye tube was then filled with the aqueous copper sulfate solution described in Example II and sealed. The sealed dye tube was then placed in a conventional dyeing machine. The fluid of the dyeing machine was maintained at 105° C. as the sealed dye tube was tumbled for one hour. The dye tube was then removed and the aqueous cuprous ion solution was replaced by the thiosulfate sulfiding solution described in Example II. Again, the dye tube was tumbled in the dyeing machine for one hour at 105° C. Following the sulfiding treatment, the fabric was washed and scrubbed in water by hand and then washed and dried in a conventional washer and dryer. The conductive treated fabric was found to have gained 24 percent in weight as compared to untreated fabric. The resistance of the fabric was 0.7 ohms/square.

EXAMPLE IV

The conductive treatment of sulfonated, stretched continuous polybenzimidazole fiber precursor prepared as in Example II for the staple fiber for production of fabric was examined. Using 7800 filament tow initially having 1.5 denier per filament, the tow was treated for one hour in an aqueous copper sulfate solution as described in Example II, followed by a 1.0 hour sulfiding treatment in a thiosulfate solution as described in Example II. The cuprous ion treatment produced a weight gain of 36 percent compared with the untreated tow and bluish fibers having a conductivity of 4 ohms per cm. After the sulfiding treatment, the tow weighed 34 percent more than the untreated tow and had a resistance of 11.5 ohms/cm.

EXAMPLE V

Various samples of polybenzimidazole papers were prepared by wet-laying dilute slurries (approximately 3-8 g./4 l.) of polybenzimidazole fibers and fibrids on a Noble and Wood hand sheet casting machine. The fibers and fibrids were previously treated as described in Table 4. The fibrids were initially wet and were treated and blended for paper-making without drying.

TABLE 4

| Sample | Type | Duration of Cuprous Ion Treatment*(hr) | Fibers Duration of Sulfiding Treatment*(hr) | Weight Gain (%) | Resistance (ohm/cm) |
| --- | --- | --- | --- | --- | --- |
| 1 | | | Untreated | | |
| 2 | 11.m tow | 1.0 | 0.5 | 27 | 20 |
| 3 | 3 lengths | 1.0 | 0.5 | 60 | 3.4 |

TABLE 4-continued

| Sample | 2'/tow | | | | |
|---|---|---|---|---|---|
| 4 | 20' tow | 1.0 | 0.75 | 24 | 1.9 |
| 5 | | | Untreated | | |
| 6 | 20' tow | 1.0 | 0.75 | 24 | 1.9 |
| 7 | | | Untreated | | |
| 8 | | | Untreated | | |

| | | Fibrids | | | |
|---|---|---|---|---|---|
| Sample | Type | Cuprous Ion Treatment and Duration | Sulfiding Treatment and Duration | Initial Solids Content (g.) | Final Solids Content (g.) |
| 1 | | | Untreated | | |
| 2 | | | Untreated | | |
| 3 | | | Untreated | | |
| 4 | | | Untreated | | |
| 5 | 200 g. wet fibrids (7.5% solids) | Aqueous 1 liter solution of 50 g. copper sulfate and 25 g. hydroxylamine for 1.0 hr. | Aqueous 200 cm.$^3$ solution of 50 g. sodium thiosulfate for 1.0 hr. | 15 | 34 |
| 6 | | | Same as Sample 5 | | |
| 7 | 200 g. wet fibrids (7.5% solids) | Aqueous 0.5 liter solution of 25 g. copper sulfate and 25 g. hydroxyl-amine for 1.0 hr. | Aqueous 100 cm.$^3$ solution of 25 g. sodium thiosulfate for 1.0 hr. | 15 | 24.5 |
| 8 | | | Same as Sample 7 | | |

*Cuprous ion and sulfiding solutions as described in Example I

All of the papers were nominally 2 oz./yd.$^2$ (excluding copper sulfide) and 70/30 fiber/fibrid blends. The papers were conventionally made with the fibers being chopped and dispersed with fibrids, and then wet laying the fiber/fibrid blends. Visual inspection of the papers revealed that part of the copper sulfide was removed from the fibers and/or fibrids during paper-making.

The resulting polybenzimidazole papers were conventionally evaluated for DC resistance. The results are tabulated in Table 5.

TABLE 5

| Sample | DC Resistance (ohms/square) |
|---|---|
| 1 | >1 × 10$^9$ |
| 2 | >1 × 10$^9$ |
| 3 | 2 × 10$^6$ |
| 4 | 168 |
| 5 (tested twice) | 426, 436 |
| 6 | 83 |
| 7 | 2430 |
| 8 | 3490 |

The DC resistances obtained for the various papers indicate that they could be useful as electrical shielding and grounding materials, antistatic copier papers, for fabrication of conductive composite materials, etc. Also, the AC impedances of Samples 5 and 6 were conventionally- evaluated in the $K_a$ band (27.4–38.7 GH$_z$) and found to be 150Ω and 260Ω for Sample 5 and 100Ω for Sample 6. These AC impedances were in the range which is useful for multilayer microwave radiation absorbers, and the capacitive coupling which gave rise to a large imaginary component in the impedance could be valuable in widening the bandwidth of the radiation absorption of the material.

Although the invention has been described with preferred embodiments, it is to be understood that variations and modifications may be employed without departing from the concept of the invention as defined in the following claims.

We claim:

1. An electrically conductive film comprising polybenzimidazole film material in association with approximately 5 to 60 percent by weight of covellite copper sulfide, based upon the total weight of the product.

2. The electrically conductive film of claim 1 wherein said polybenzimidazole film material is a porous, microporous, or semipermeable membrane.

3. The electrically conductive film of claim 1 wherein said covellite copper sulfide is primarily located on at least one surface of the polybenzimidazole film material.

4. The electrically conductive film of claim 1, comprising from about 5 to about 15 weight percent of said covellite copper sulfide.

5. The electrically conductive film of claim 1 comprising from about 25 to about 35 weight percent of said covellite copper sulfide.

6. The electrically conductive film of claim 1, wherein said film exhibits a sheet resistivity in range of from about 1 to about 1000 ohms/square.

7. The electrically conductive film of claim 6, wherein said film exhibits a sheet resistivity in the range of from about 100 to about 1000 ohms/square.

8. A monolithic electrically conductive composite article comprising electrically conductive polybenzimidazole fibrous material in association with approximately 5 to 60 percent by weight of covellite copper sulfide based upon the total weight of the conductive fibrous product, incorporated within a substantially continuous polymeric matrix.

9. The composite article of claim 8, comprising from about 0.1 to about 35 percent by volume of said electrically conductive polybenzimidazole fibrous material.

10. The composite article of claim 8, comprising from about 0.5 to about 2.5 percent by volume of said electrically conductive polybenzimidazole fibrous material.

11. The composite article of claim 8, comprising from about 1 to about 10 percent by volume of said electrically conductive polybenzimidazole fibrous material.

12. The composite article of claim 8, comprising from about 10 to about 30 percent by volume of said electrically conductive polybenzimidazole fibrous material.

13. The composite article of claim 8, wherein said article exhibits an average electrical conductivity in the range of from about $10^{-6}$ to about 10 ohm$^{-1}$ cm$^{-1}$ at 25° C., measured in at least one direction.

14. The composite article of claim 8, wherein said article exhibits an average electrical conductivity in the range of from about $10^{-6}$ to about $10^{-3}$ ohm$^{-1}$cm$^{-1}$ at 25° C., measured in at least one direction.

15. The composite article of claim 8, wherein said article exhibits an average electrical conductivity in the range of from about 0.1 to about 10 ohm$^{-1}$ cm$^{-1}$ at 25° C., measured in at least one direction.

16. The composite article of claim 8, wherein said article is formed into a sheet having a thickness of approximately mil to 1 inch and exhibits a sheet resistivity in the range of from about 100 to about 1000 ohms/square.

17. A monolithic electrically conductive composite article comprising a fabric, paper, or felt which includes polybenzimidazole fibrous material in association with approximately 5 to 60 weight percent of covellite copper sulfide, said fabric, paper, or felt being incorporated within a solid continuous polymeric matrix.

18. The composite article of claim 17, wherein said continuous polymeric matrix contains additional finely divided electrically conductive polybenzimidazole fibrous material in association with approximately 5 to 60 weight percent of covellite copper sulfide.

19. A monolithic electrically conductive composite article comprising polybenzimidazole fibrous material in association with approximately 35 to 60 percent by weight of covellite copper sulfide incorporated within a solid continuous cured epoxy resin matrix.

20. A polymer composition suitable for use in electrically conductive end uses comprising electrically conductive polybenzimidazole fibrous material in association with approximately 5 to 60 weight percent of covellite copper sulfide and a polymeric carrier.

21. The composition of claim 20, wherein said polymeric carrier exhibits adhesive characteristics and said composition is suitable for use as an electrically conductive adhesive.

22. The composition of claim 20, wherein said polymeric carrier comprises at least one polymer selected from the group consisting of epoxy polymers, silicone polymers, neoprenes, acrylates, cyanoacrylates, and polyurethanes.

23. The composition of claim 20, wherein said polymeric carrier is a thermoplastic polymer capable of being molded and said composition is suitable for use in the formation of electrically conductive molded articles.

24. The composition of claim 23, wherein said thermoplastic polymer is selected from the group consisting of polyolefins, polyesters, polyamides, polyacetals, polycarbonates, and mixtures thereof.

25. The composition of claim 23, wherein said thermoplastic polymer is selected from the group consisting of vinyl polymers, ABS copolymers, polyphenylene oxide, polyphenylene sulfide, polysulfones, polyether sulfones, polyetherether ketones, polyetherimides, polysilicones, polyurethanes, and polyarylates.

26. The composition of claim 20, wherein said polymeric carrier is capable of forming a continuous coating and said composition is suitable for use in the formation of a continuous electrically conductive coating.

27. A sheetlike article comprising polybenzimidazole fibrous material in association with from about 5 to about 60 percent by weight of electrically conductive covellite copper sulfide, said sulfide being present in at least one layer comprising a multiplicity of said fibers, and having a thickness of approximately 1 mil to 1 inch, said article having a sheet resistivity in one range of from about 1 to about 1000 ohms/sheet.

* * * * *